United States Patent [19]

Kamio et al.

[11] Patent Number: 5,312,600
[45] Date of Patent: May 17, 1994

[54] SILICON SINGLE CRYSTAL MANUFACTURING APPARATUS

[75] Inventors: Hiroshi Kamio; Kenji Araki; Yoshinobu Shima; Makoto Suzuki; Takeshi Kaneto; Yasumitsu Nakahama; Takeshi Suzuki; Akio Fujibayashi, all of Tokyo, Japan

[73] Assignee: Toshiba Ceramics Co., Handano, Japan

[21] Appl. No.: 50,732

[22] Filed: Apr. 20, 1993

Related U.S. Application Data

[63] Continuation of Ser. No. 775,984, filed as PCT/JP91/00366, Mar. 19, 1991, abandoned.

[30] Foreign Application Priority Data

Mar. 20, 1990 [JP] Japan .................................. 2-70054
Apr. 18, 1990 [JP] Japan ................................. 2-102417

[51] Int. Cl.⁵ ............................................. C30B 15/30
[52] U.S. Cl. .................................... 117/213; 117/217; 117/900; 117/932
[58] Field of Search ............... 156/617.1, 618.1, 620.4, 156/DIG. 64; 422/248, 249, 253

[56] References Cited

U.S. PATENT DOCUMENTS

| | | | |
|---|---|---|---|
| 4,330,362 | 5/1982 | Zulehner | 422/249 |
| 4,894,206 | 1/1990 | Yamashita et al. | 156/618.1 |
| 4,911,895 | 3/1990 | Kida et al. | 156/617.1 |
| 4,956,153 | 9/1990 | Yamagishi et al. | 422/249 |
| 4,957,712 | 9/1990 | Shima et al. | 156/617.1 |
| 4,980,015 | 12/1990 | Ono et al. | 156/DIG. 64 |
| 5,009,862 | 4/1991 | Kida et al. | 156/617.1 |
| 5,009,863 | 4/1991 | Shima et al. | 156/DIG. 83 |
| 5,073,229 | 12/1991 | Yamashita et al. | 422/249 |

FOREIGN PATENT DOCUMENTS

| | | |
|---|---|---|
| 0308308 | 3/1989 | European Pat. Off. |
| 0425065 | 5/1991 | European Pat. Off. |
| 1317188 | 12/1989 | Japan |
| 1317189 | 12/1989 | Japan |
| 2172885 | 7/1990 | Japan |

Primary Examiner—Olik Chaudhuri
Assistant Examiner—Felisa Garrett
Attorney, Agent, or Firm—Michael N. Meller

[57] ABSTRACT

An apparatus for making a silicon single crystal large in diameter dependently on the Czochralski process, wherein appropriate openings (11) are provided on the warmth keeping over (10) so as to prevent an undesirable influence caused by atmospheric gas. The major elements of the apparatus are that the sum of areas of the openings (11) is larger than the area of gap (18) formed between the lower end of the warmth keeping cover (10) and the level of silicon solution, and that the warmth keeping cover and the heat insulating member (12) are composed of sheet metal.

7 Claims, 10 Drawing Sheets

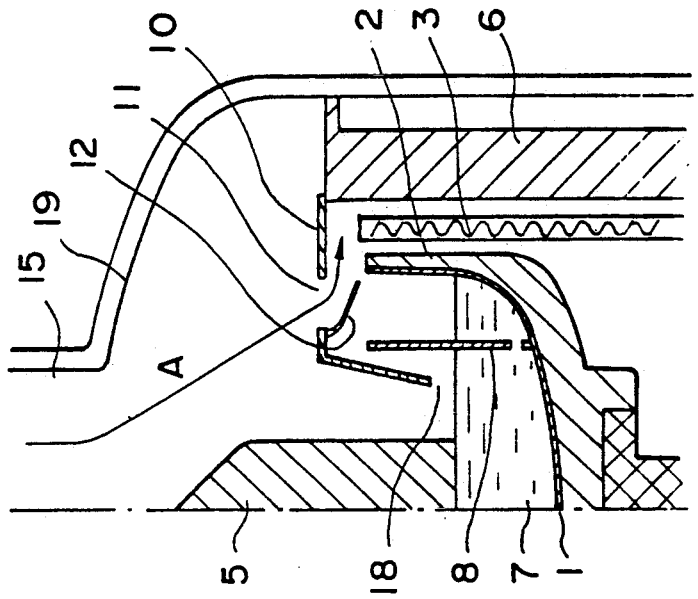
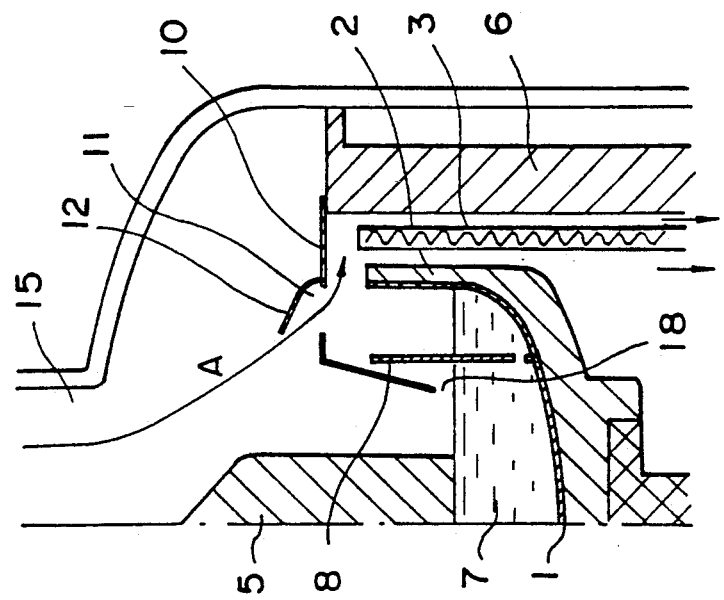

SILICON SINGLE CRYSTAL MANUFACTURING APPARATUS

This application is a continuation of application Ser. No. 775,984, filed as PCT/JP91/00366, Mar. 19, 1991, now abandoned.

TECHNICAL FIELD

The present invention relates to an apparatus for manufacturing large-diameter silicon single crystals according to the Czochralski method.

BACKGROUND ART

The diameter required for silicon single crystals has been tending to increase year after year. Presently, silicon single crystals of 6 inches in diameter are used for the latest device. Then, it is said that silicon single crystals of 10 inches or more in diameter will be needed in the future.

The silicon single crystals used in the field of LSIs are usually manufactured by the Czochralski method (CZ method) in which after a seed crystal has been dipped and adapted to the molten silicon contained within a rotating quartz crucible, the seed is slowly rotated and pulled, and according to this CZ method the molten silicon is decreased as a silicon single crystal grows. As a result, as the silicon single crystal grows, the dopant concentration in the silicon single crystal is increased and the oxygen concentration is decreased. In other words, the properties of the silicon single crystal are varied in the direction of its growth. Paralleling the tendency toward increasing the level of integration for LSIs, the quality required for silicon single crystals becomes increasingly severe year after year and this problem must be overcome.

As a means of overcoming this problem, a method has been known from old in which the interior of a quartz crucible according to the CZ method is divided by a cylindrical quartz partition member formed with small holes for passing molten silicon therethrough and a cylindrical silicon single crystal is grown on the inner side (a single crystal growing section) of the partition member while feeding starting material silicon to the outer side (a material melting section) of the partition member (e.g., Patent Publication No. 40-10184, "Detailed Explanation of the Invention", line 13 to line 28). The problem with this method is that solidification of the molten silicon tends to occur starting at the partition member on the inner side of the partition member as pointed out by Laid-Open Patent No. 62-241889 (page 2, "problems that the Invention is to solve", line 12 to line 16). In other words, the solidification is caused at the portion where the molten silicon surface of the crystal growing section is in contact with the partition member. This solidification grows towards the central portion of the crucible the temperature is low and the growth of the silicon single crystal is impeded. This is caused by the fact that since transparent silica glass usually used for the partition member tends to pass heat radiation and moreover in the usual case there is a considerable dissipation of heat to the water-cooled furnace wall from the portion of the top of the partition member which is exposed on the molten silicon surface, the heat in the molten silicon is transmitted upwardly through the partition member and the heat is dissipated from the portion of the partition member which is exposed on the molten silicon surface. As a result, the molten silicon temperature is greatly decreased in the vicinity of the partition member. Moreover, due to the intense agitation of the molten silicon, the surface temperature of the molten silicon attains a temperature which is uniform and slightly above the solidifying point. Thus, the molten silicon surface contacting with this partition member is in a condition having an extremely high tendency to cause its solidification. The previously mentioned Laid-Open Patent No. 62-241889 proposes a method employing no partition member in order to overcome this problem. In this method, however, the material melting section is so limited that particularly when a large-diameter silicon crystal is to be manufactured, it is difficult to melt the starting material silicon in an amount corresponding to the pulled amount of the silicon single crystal.

Recently, the production of high-quality granular silicon has been made possible and it is considered that to continuously feed such granular silicon as the starting material silicon into the molten silicon is relatively easy. However, if a sufficient heat for melting the granular silicon is not applied to the granular silicon when it is supplied onto the molten silicon surface, there is the possibility of causing a part of the granular silicon to remain unmelted. It is not infrequent that solidification is caused from the remaining unmelted granular silicon and the solidification spreads out. The reason is that due to the difference in specific gravity between the molten silicon and the granular silicon, the solid granular silicon floats to the molten silicon surface and its heat tends to be deprived of due to the radiation rate of the solid silicon being greater than that of the molten silicon. In particular, if the granular silicon is deposited and aggregated on the partition member at the molten silicon surface in the material melting section, as in the case of the solidification in the crystal growing section, the heat is rapidly lost through the partition member thus tending to cause the occurrence of solidification and its spreading. This problem is essentially the same even if the starting material silicon is in any other form than the granular silicon. In regard to this problem, in accordance with the method shown in Laid-Open Patent No. 61-36197 a "heat insulating cover" is arranged above the material melting section to facilitate rapid melting of the granular silicon (Claim 6).

Proposed by Laid-Open Patent No. 1-153589 is a method in which a partition member is employed and also the occurrence of solidification at the partition member is prevented. This invention proposes to completely cover the partition member by a heat keeping cover. In accordance with this method, the dissipation of heat from the partition member is prevented and hence the occurrence of solidification is prevented. Also, the melting capacity for the starting material silicon to be fed is sufficient. However, it has been found out that this invention is still insufficient for stably performing the growth of silicon single crystals.

The present invention has been made in view of these circumstances and it is an object of the present invention to provide a silicon single crystal amanufacturing apparatus which stably realizes the growth of a silicon single crystals over a long period of time.

SUMMARY OF THE INVENTION

The inventors, have made many studies and investigations and found that the method shown in Laid-Open Patent No. 1-153589 is not able to stably grow a silicon single crystal because the flow of gas for furnace atmosphere (argon gas) is not proper. This will be explained in detail with reference to FIG. 6. In the method shown in Laid-Open Patent No. 1-153589, a heat keeping cover 10 is provided so that the flow of the atmosphere gas becomes as indicated by an arrow B in FIG. 6. In other words, practically all the atmosphere gas introduced into the furnace within a pull chamber 15 is passed through the space 18 between the lower end of the heat keeping cover 10 and the surface of molten silicon 7, the space between the heat keeping cover 10 and a partition member 8, the space formed at the upper ends of a quartz crucible 1 and a graphite crucible 2 and the space between an electric resistance heater 3 and the graphite crucible 2 or the space between the electric resistance heater 3 and an insulating material 6 and discharged through the furnace bottom. Since the atmosphere gas is at about the room temperature, when passing by near the molten silicon surface, the gas is mixed with SiO vapor evaporated from the molten silicon surface thereby cooling the SiO vapor. Thus, fine particles of SiO are produced in the vicinity of the molten silicon surface. These fine particles aggregate so that they fall on the molten silicon surface and then deposit on the solid-liquid interface of a silicon single crystal 5. This results in the occurrence of dislocation and the silicon single crystal is disintegrated. Where the furnace pressure is at the atmospheric pressure (1 atmosphere), even if fine particles of SiO are produced more or less, the possibility of the fine particles falling is not so great. This is due to the fact that the fine SiO particles are entrained on the strong stream of the atmosphere gas and are discharged. However, in the case of a furnace supporting the growing of a large-diameter silicon single crystals over a long period of time as the present invention, in order to reduce the deposition of the fine SiO particles on the inner wall of the furnace and in order to prevent the carbons generated from the carbon materials within the furnace from entering a silicon single crystal, the furnace pressure is reduced to 0.01 to 0.1 atmosphere. Therefore, the generated fine SiO particles have a very high tendency to fall.

On the other hand, while, in the method shown in Laid-Open Patent No. 61-36197, the "heat insulating cover" is provided in the form of covering the material melting section, there is the disadvantages of taking no countermeasure against the occurrence of solidification from the inside of the partition member and such solidification cannot be prevented.

FIG. 5 is a schematic diagram showing the gas flow in an embodiment of the present invention. A first feature of the present invention resides in the provision of openings 11 formed in the upper part of a heat keeping cover 10.

Also, another embodiment of the present invention features that openings 11 are formed in the upper part of a heat keeping cover 10 in such a manner that their total area is greater than the area of a space 18 between the lower end of the heat keeping cover 10 and the surface of molten silicon 7 (FIGS. 2, 3 and 4 and FIGS. 11 and 12 show respectively perspective views of heat keeping covers formed with openings and perspective views of heat keeping covers and heat shielding members according to embodiment of the present invention) and that in FIGS. 11 and 12 the heat shielding members 12 are respectively provided above and below the openings 11 in the heat keeping plate 10. FIGS. 5, 13 and 14 are schematic diagrams showing respectively the gas streams in these cases. In each of the Figures, a large part of the atmosphere gas flows as a gas stream indicated by an arrow A. In other words, the atmosphere gas is passed through the openings 11 from a pull chamber 15 and through between an electric resistance heater 3 and a graphite crucible 2 or between the electric resistance heater 3 and a heat insulator 6 so that the gas flows toward the furnace bottom and it is discharged to the outside of the furnace.

Since the atmosphere gas is at the room temperature, in the case such as Laid-Open Patent No. 1-153589 or in the case of FIG. 6, when passing by near the molten silicon surface, the gas is mixed with SiO vapor evaporated from the molten silicon surface thereby cooling the latter. FIG. 8 shows the results of a simulation of the furnace gas temperature distribution in such case and this situation is indicated satisfactorily. A low gas temperature region of below 1000° C. extends to the space portion 18 between the cylindrical portion of the heat keeping cover 10 and the surface of the molten silicon 7. As a result, fine particles of SiO are generated in the vicinity of the molten silicon surface. These fine particles aggregate and fall on the molten silicon surface so that the fine particles are deposited on the solid-liquid interface of a silicon single crystal. Then, the silicon single crystal is disintegrated. Where the furnace pressure is at the atmospheric pressure (1 atmosphere), even if fine SiO particles are generated more or less, they are not caused to fall. The reason is that the fine particles are entrained on the strong stream of the atmosphere gas and are discharged. However, in the case of a furnace which supports the growing of a silicon single crystal having a large diameter of 5 inches or more over a long period of time as in the case of the present invention, in order to reduce the deposition of the SiO particles on the inner wall of the furnace and also in order to prevent the carbons generated from the carbon members within the furnace from entering a silicon single crystal, the furnace pressure is reduced to 0.01 to 0.1 atmosphere. Therefore, the generated fine particles have a very strong tendency to fall.

Also, in accordance with the method of the present invention, practically there is no occurrence of the gas flow just above the surface of the molten silicon 7 as caused by the method shown in Laid-Open Patent No. 1-153589. With the flow of the atmosphere gas according to the present invention, in order that the gas flow becomes as shown by the arrow A in FIG. 5, 13 or 14, the height direction positions of the openings 11 should preferably be as high as possible, particularly they should preferably be at least higher than the upper end of the electric resistance heater 3. The reason is that the gas streams A tend to flow easily in the upper part. In other words, this is effective in preventing the gas streams B (FIG. 6) . Further, the openings 11 must be wide enough. In other words, the wider, the better from the gas flow point of view. However, the presence of wide openings is not desirable from the essential intended purpose of heat keeping purpose of the heat keeping cover 10. In other words, there is the danger of ruining the object of the heat keeping cover, i.e., the prevention of solidifcation at the partition member. In particular, where the diameter of a silicon single crystal to be grown is increased or where the pull rate of a silicon single crystal is improved so that the pulling amount of the silicon single crystal is increased thus requiring the supply of the corresponding amount of starting material silicon, to widen the openings 11 gives rise to a problem.

In other words, where the feed rate of the starting material becomes greater than a certain level, if the openings 11 are arranged above the material melting section, there is the possibility that the starting material silicon supplied cannot be melted rapidly and eventually the starting material silicon, in its solid state is accumulated on the outer side of the partition member. In the presence of the openings, the molten silicon surface is positioned opposite to a water-cooled furnace wall 19 in the furnace upper part and such phenomenon has an extremely large tendency to occur.

Although the openings 10 are arranged as gas passages from the pull chamber 15 to a space 23 formed at the upper end of the electric resistance heater at such positions where the gas is easy to flow, by-pass streams B (FIG. 6) will be caused if the openings 10 are excessively small. For this reason, the lower limit to the area of the openings is set to 50 cm$^2$ or over. The reasons for the lower limit of 50 cm$^2$ is as follows. For example, when growing silicon single crystals of 5 inches in diameter, the diameter of the partition member 8 is about 30 cm. In this case, there is the possibility of a space 24 between the partition member 8 and the heat keeping cover 10 being reduced to 5 mm at the upper end of the partition member 8. In other words, there is the possibility that the cross-sectional area of the space between the partition member and the heat keeping cover becomes about 50 cm$^2$. In order that the gas streams A may constitute the greater part, the area of the openings 11 must be greater than the previously mentioned value. The upper limit to the area of the openings is selected as 1000 cm$^2$. This corresponds to a little less than 90% of the liquid surface area of the material melting section if the crucible diameter selected is 22 inches and the partition member diameter selected is 16 inches (for silicon single crystals of 8 inches in diameter).

If the openings are made greater than this value, such deficiencies as mentioned previously will be caused.

Thus, in accordance with another embodiment of the present invention a heat shielding member 12 is arranged above or below each of the openings 11 (see FIGS. 9 and 10). Each shielding member 12 is formed into such shape which does not impede the flow of the atmosphere gas. In this way, while ensuring the required size of the openings for the gas flow, the heat shielding members 12 for covering the respective openings are added thereby simultaneously satisfying the essential object of the heat keeping cover 10, i.e., the keeping of heat.

In accordance with the present invention, each of the heat shielding members 12 should preferably be made from a metal sheet. In the case of graphite which is generally used as a material for the furnace components of the silicon single crystal furnace, its rate of radiation is so high that its heat shielding effect is low and there is a possibility of facilitating the heat dissipation from the molten silicon surface according to circumstances. The metal sheet is low in radiation rate and high in heat shielding effect and it is well suited for the intended application of the heat shielding members.

Further, in accordance with the present invention the heat keeping cover 10 can be made from a metal sheet. The reason is that while various materials such as graphite and ceramics may be considered, the metal is greater in heat keeping effect than these materials. Even if the heat shielding members 12 are provided, it is impossible to avoid deterioration of the heat keeping effect of the heat keeping cover due to the provision of the openings 11.

By making the heating keeping cover from a metal, it is possible to reduce the deterioration of the heat keeping effect as far as possible. As a result, even in cases where a large-diameter silicon single crystal is pulled at a high rate, there is no danger of causing solidification at the partition member and causing a part of the starting material to be left unmelted in the material melting section and the stable pulling operation is made possible.

By way of example of the arrangement of the heat shielding members 12, as shown in FIG. 9, the heat shielding members 12 are mounted on the heat keeping cover 10 so as to be arranged above the heat keeping cover 10 and each of the heat shielding members 12 is apart from the heat keeping cover 10 by a space which is not less than 2 cm and not greater than 8 cm on the inner peripheral side of the heat keeping cover 10. Since the flow of the atmosphere gas is such that as shown by an arrow A in FIG. 13, the gas flows out downwardly from the pull chamber 15 arranged in the central upper part of the furnace, flows so as to spread toward the peripheral side in the space at the furnace top portion and then sucked toward the furnace bottom through the openings 11 of the heat keeping cover 10, in order to prevent this gas flow from being disturbed, the heat keeping cover 10 and each if the heat shielding members 12 are separated from each other by at least not less than 2 cm and not greater than 8 cm on the furnace inner peripheral side of the heat keeping cover 10, thereby ensuring a gas flow passage.

From the standpoint of ensuring the gas flow passage, the space between the heat keeping cover 10 and the respective heat shielding members should advantageously be selected as wide as possible. However, to widen the space considerably as compared with the width of the openings 11 is not desirable from the practical point of view. The reason for setting the upper limit to 8 cm resides in taking the utility into consideration.

By way of another example of the arrangment of the heat shielding members 12, as shown in FIG. 10, the heat shielding member 12 is arranged so as to be dependently supported below each opening 11 of the heat keeping cover 10 downwardly thereof so that the heat keeping cover 10 and each heat shielding plate 12 are separated from each other by a space of not less than 2 cm and not greater than 8 cm on the outer peripheral side of the heat keeping cover 10. Also, in this case, as shown by an arrow A in FIG. 14, the atmosphere gas flows out from the pull chamber 15 in the central upper part of the furnace downwardly so that in the furnace top space the gas flows so as to spread toward the furnace outer peripheral side and it is then sucked toward the furnace bottom through the openings 11 of the heat keeping cover 10. Thus, in order that this gas flow may not be disturbed, the heat keeping cover 10 is kept apart from each of the heat shielding members 12 by not less than 2 cm and not greater than 8 cm on the outer peripheral side of the heat keeping cover 10, thereby ensuring the flow passages for the gas.

The upper limit value is set to 8 cm for the same reason as the previously mentioned case in which the heat shielding members 12 are mounted on the heat keeping cover 10.

The reason for defining the distance set between the heat keeping cover 10 and the respective heat shielding members 12 as not less than 2 cm will now be described.

In order that the flow passages of the atmosphere gas, which are the same as in cases where they are mounted on the heat keeping cover 10, may be such that the flow passages A shown in FIGS. 5, 13 and 14 predominate the flow passages B shown in FIG. 6, the area of the spaces through which the gas passes by the flow passages A must be greater than the area of the spaces through which the gas passes by the passages B. Since the lower end of the heat keeping cover 10 is usually above the molten silicon surface by 1.5 to 2 cm, even in cases where the openings 10 are formed along the whole periphery of the heat keeping cover 10, the spaces of greater than this distance or not less than 2 cm must be ensured as the flow passages for the atmosphere gas.

BRIEF DESCRIPTION OF DRAWINGS

FIG. 13 is a diagram showing a simulation result of the temperature distribution of the atmosphere gas within the furnace in FIG. 9.

FIG. 14 is a diagram showing a simulation result of the temperature distribution of the atmosphere gas within the furnace of FIG. 10.

Here, numeral 1 designates a quartz crucible, 2 a graphite crucible, 3 an electric resistance heater, 4 a pedestal, 5 a silicon single crystal, 6 a heat insulator, 7 molten silicon, 8 a partition member, 9 small holes, 10 a heat keeping cover, 11 heat keeping cover openings, 12 heat shielding members, 13 a furnace chamber, 14 an atmosphere gas discharge port, 15 a pull chamber, 16 a starting material feed chamber, 17 a starting material feed pipe, 18 a space between the heat keeping cover lower end and the molten silicon surface, 19 a chamber upper cover, 20 the space between the upper end of the electric resistance heater and the heat insulator, and 21 the space between the upper end of the partition member and the heat keeping cover.

Designated at A are gas streams of the atmosphere gas passing through the openings of the heat keeping cover, B the gas streams of the atmosphere gas passing through the space between the lower end of the heat keeping cover and the molten silicon surface, C a material melting section, and D a single crystal growing section.

DETAILED DESCRIPTION OF THE INVENTION

Figure 1:
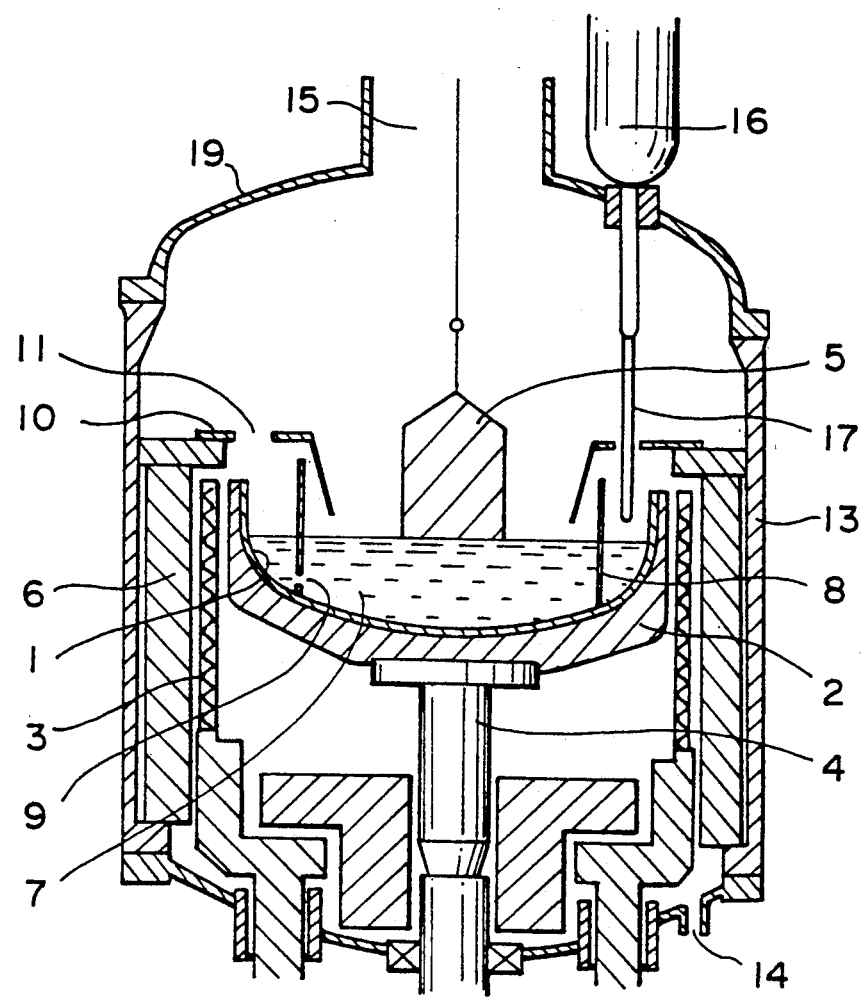
FIG. 1 is a longitudinal sectional view showing an embodiment of a silicon single crystal manufaturing apparatus according to the present invention.

The embodiments of the present invention will now be described in detail with reference to the accompanying drawings. FIG. 1 is a longitudinal sectional view of one embodiment of the present invention. In FIG. 1, numeral 1 designates a quarts crucible (about 20 inches in diameter) which is supported by a graphite crucible 2, and the graphite crucible 2 is supported on a pedestal 4 by a rotatable mechanism. Numeral 7 designates molten silicon contained in the crucible 1 and a silicon single crystal 5 grown into a cylindrical shape is pulled from the molten silicon 7. In accordance with the present embodiment, the diameter of the silicon single crystal is 6 inches and the pull rate is 1.6 mm per minute on an average. Numeral 3 designates a resistance heater surrounding the graphite crucible, and 6 a heat insulator surrounding the electric resistance heater 3, with all of these components being accommodated in a chamber 13. An atmosphere gas (argon gas) is introduced into the furnace through a gas inlet (not shown) formed in the upper part of a pull chamber 15 and it is discharged from a discharge port 14 formed in the furnace bottom by a decompression device. The furnace pressure within the furnace is 0.3 atmosphere. The foregoing is all the same with the silicon single crystal manufacturing apparatus according to the ordinary Czochralski method.

Numeral 8 designates a partition member which is made from high-purity silica glass and arranged inside the crucible 1 so as to be coaxial with the crucible 1. The partition member 8 is formed with small holes 9 so that the molten silicon in a material melting section C (on the outer side of the partition member 8) flows unidirectionally into a single crystal growing section D (on the inner side of the partition member 8) via the small holes 9. The upper edge portion of the partition member 8 is exposed on the surface of the molten silicon 7 and its lower edge portion is preliminarily fused to the quartz crucible 1 or fused to the crucible 1 by the heat generated when preparing the molten silicon 7 by melting starting material silicon during the initial period. Granular silicon is delivered to a starting material feed pipe 17 from a storage hopper (not shown) within a starting material feed chamber (unit) 16 through a measuring device (not shown) thereby feeding the granular silicon continuously to the mateial melting section C. The feed rate is constant at about 70 grams per minute which is equal to the pull rate of the silicon single crystal from the single crystal growing section D.

Figure 2:
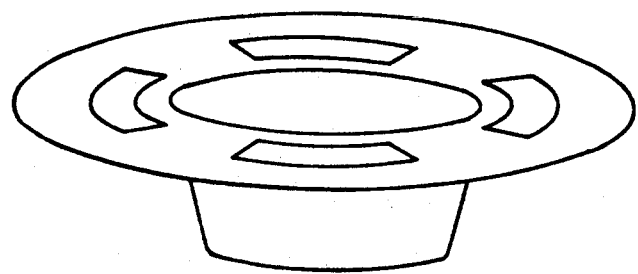
FIG. 2 is a perspective view showing an embodiment of the heat keeping cover in the silicon single crystal manufacturing apparatus in FIG. 1.
Figure 3:
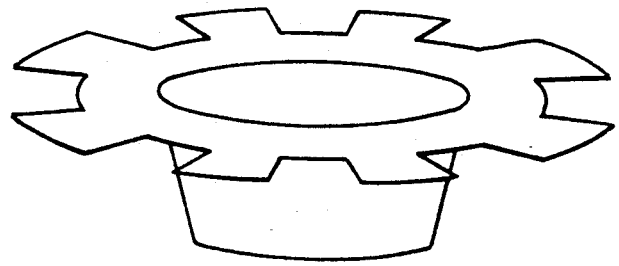
FIG. 3 is a perspective view showing another embodiment of the heat keeping cover in FIG. 1.
Figure 4:
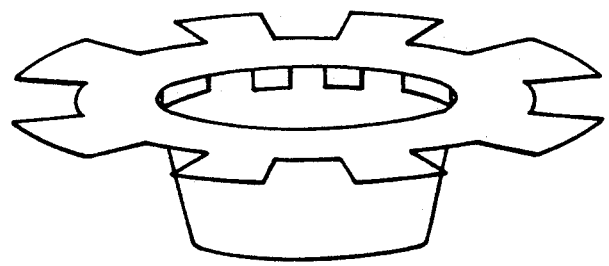
FIG. 4 is a perspective view showing still another embodiment of the heat keeping cover in FIG. 1.
Figure 5:
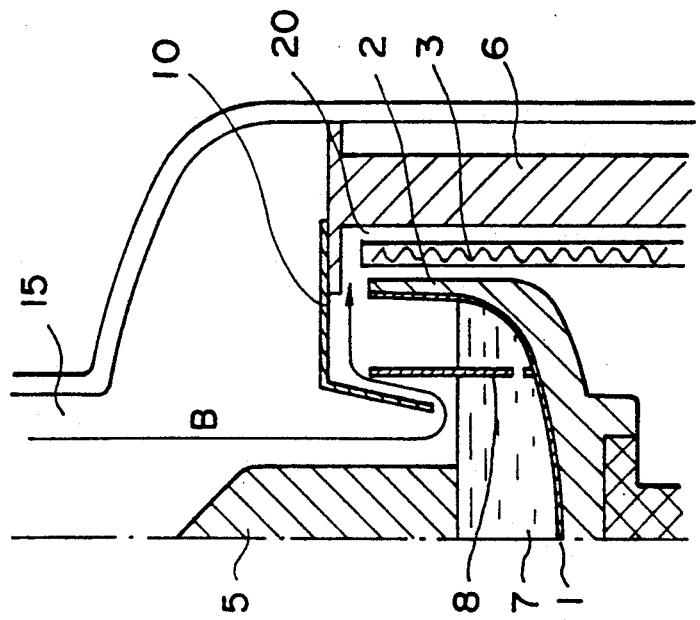
FIG. 5 is a schematic diagram of the gas flow in the embodiment of the present invention shown in FIG. 1.
Figure 6:
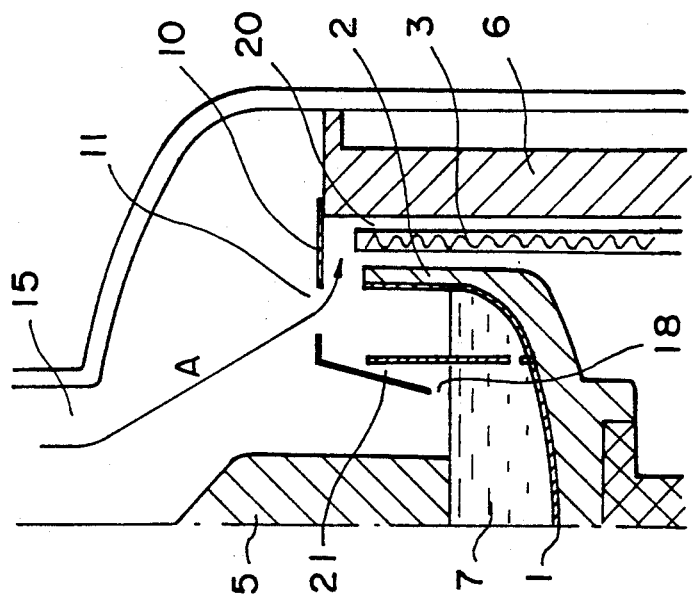
FIG. 6 is a schematic diagram of the has flow in a conventional embodiment.
Figure 8:
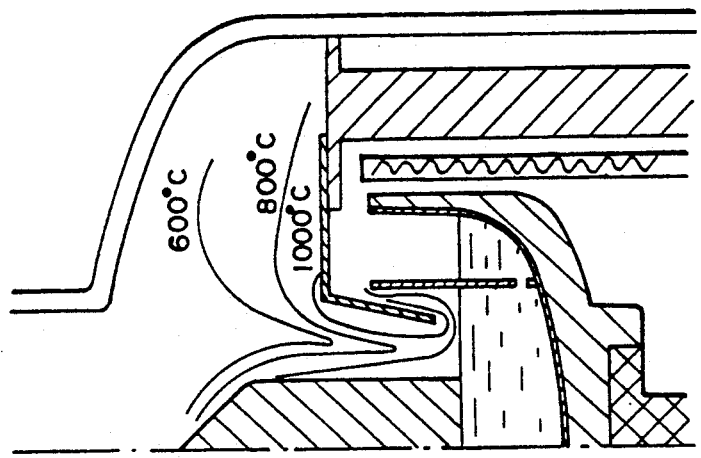
FIG. 8 is a diagram showing a simulation result of the atmosphere gas temperature distribution in FIG. 6.
Figure 7:
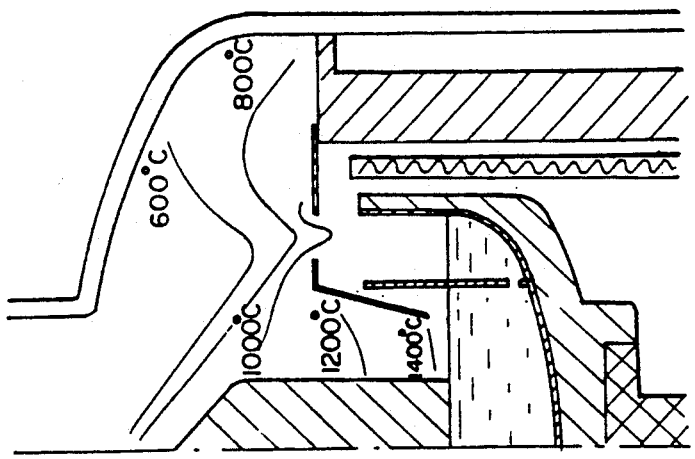
FIG. 7 is a diagram showing a simulation result of the atmosphere gas temperature distribution in the furnace of FIG. 5.

Numeral 10 designates a heat keeping cover which is made from a tantalum sheet of 0.2 mm in thickness. Numeral 11 designates openings of 90 cm$^2$ formed through the heat keeping cover 10 and in accordance with an embodiment the openings 11 are formed at four locations as shown in FIG. 2 with the total area of the openings amounting to 360 cm². About 80% of the whole periphery of the heat keeping cover corresponds to the openings 11.

The cylindrical portion of the heat keeping cover has a diameter of 34 cm at its upper end. As a result, a space 21 between the partition member and the heat keeping cover in the vicinity of the upper end of the partition member 8 has a cross-sectional area of a little over 60 cm². Also, the lower end of the cylindrical portion of the heat keeping cover has a diameter of 20 cm. Also, a space between the lower end and the liquid surface is 1.5 cm. Thus, the area of this space portion is about 90 cm². Since the area (360 cm²) of the openings 22 of the heat shielding members is sufficiently large as compared with the areas of the previously mentioned spaces, practically all the gas passes through the openings 11 (the gas flow passages A). This fact has a great effect on the stabilization of the crystal growth. While the disintegration of silicon single crystals has been caused frequently without the openings 22, after the provision of these openings it has been made possible to ensure the stable growth of long crystals exceeding 1 m.

While, in this embodiment, the openings are formed at 4 locations, there is no particular limitation to the number of openings. In order to improve the symmetrical characteristic for a silicon single crystal, the openings at uniformly arranged two locations is more desirable than the opening at one location. The reason is that the improved symmetry of the heat environment for a silicon single crystal is desirable for stabilizing the silicon single crystal growth.

Since the area is sufficiently greater than the area of the space 18 over the whole periphery between the lower end of the heat keeping cover 10 and the molten silicon surface in the single crystal growing section D, practically all the atmosphere gas flows along the gas flow passages A. As a result, the generation of fine SiO particles and their falling onto the molten silicon surface in the single crystal growing section D is reduced and practically no disintegration of silicon single crystals is caused.

Also, where the heat shielding members 12 are not used, when pulling a silicon single crystal having a diameter greater than a certain limit, during its pulling the remaining of partial unmelted granular silicon and the solidification of the granular silicon in the material melting section C are caused and thus the supply of the granular silicon is frequently interrupted, thereby giving rise to a serious detrimental cause against the growth of a silicon single crystal. In this case, the use of the heat shielding members 12 has the effect of preventing the occurrence of such phenomenon.

While, in this embodiment, the openings are also formed at four locations, there is no particular limitation to the number of openings. For the stabilization of the growth of silicon single crystals, however, it is desirable to improve the symmetry of the heat environment within the furnace so that from this point of view the openings should preferably be arranged at equal intervals at two or more locations on the circumference than at one location.

Figure 10:
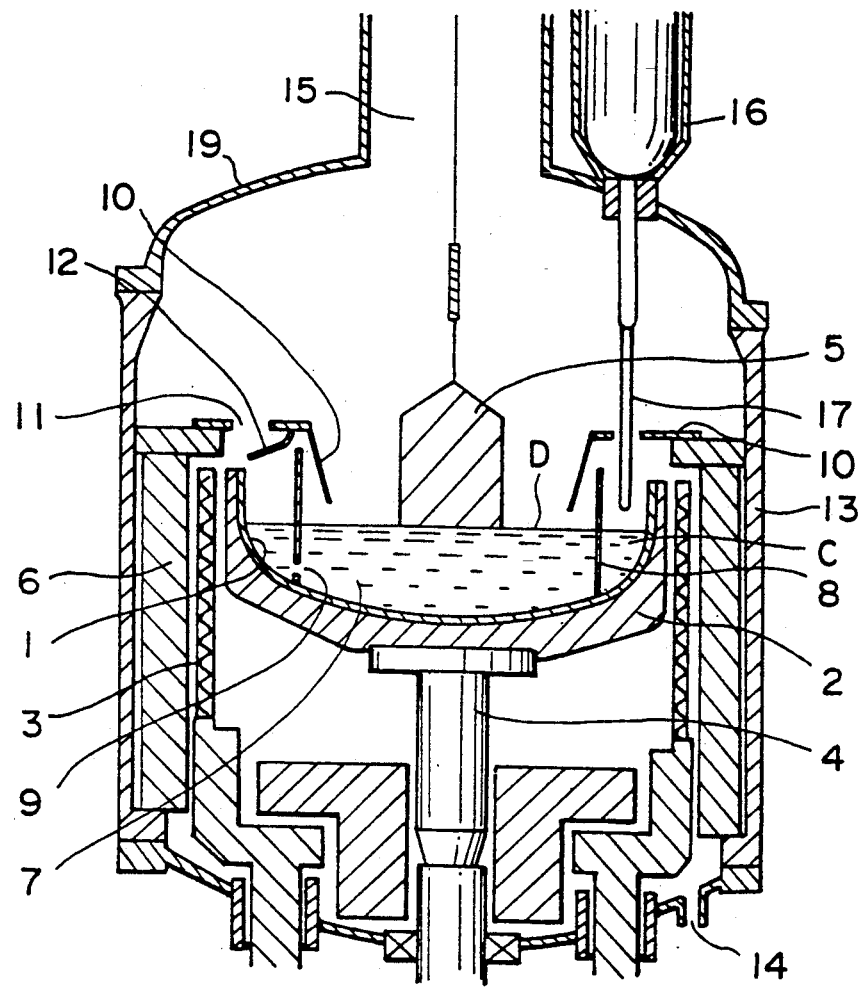
FIG. 10 is a longitudinal sectional view showing still another embodiment of the silicon single crystal manufacturing apparatus according to the present invention.
Figure 11:
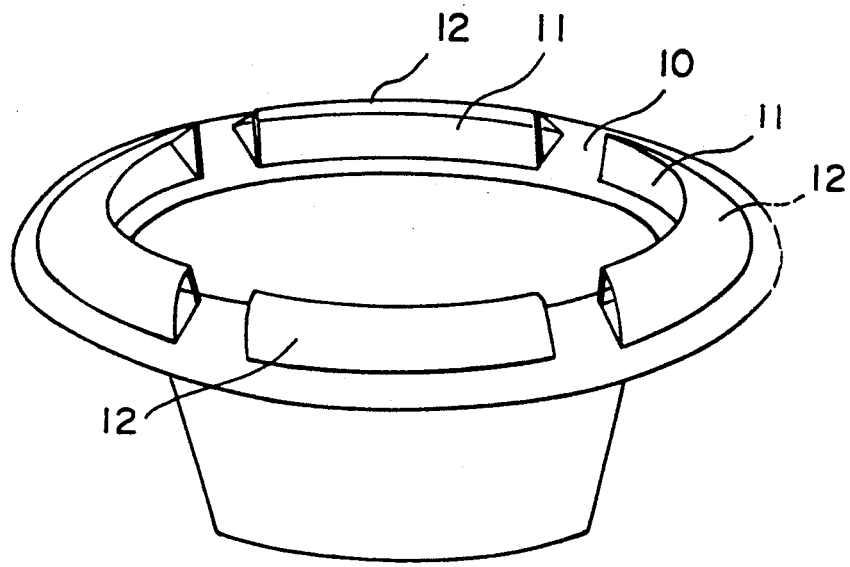
FIG. 11 is a perspective view showing an embodiment of the heat keeping cover in FIG. 9.
Figure 12:
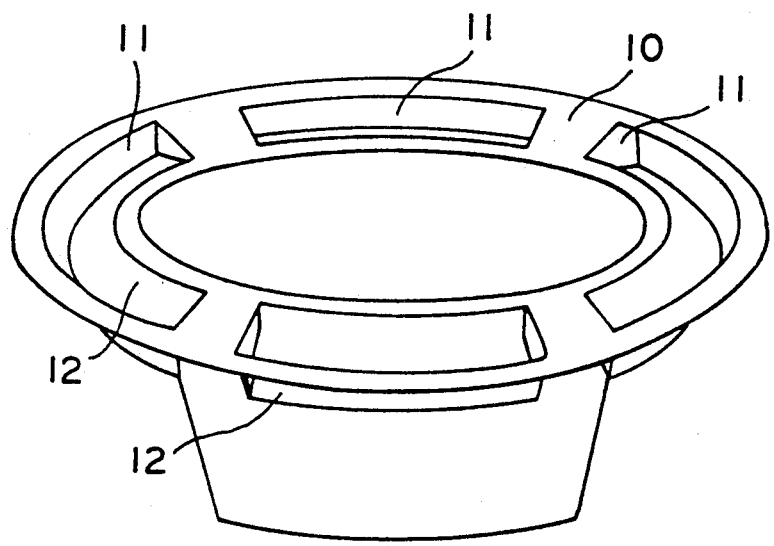
FIG. 12 is a perspective view sowing an embodiment of the heat keeping cover in FIG. 10.

FIG. 10 is a longitudinal sectional view showing schematically another embodiment of the present invention, and FIG. 12 shows an embodiment of the heat keeping cover in FIG. 10.

Figure 9:
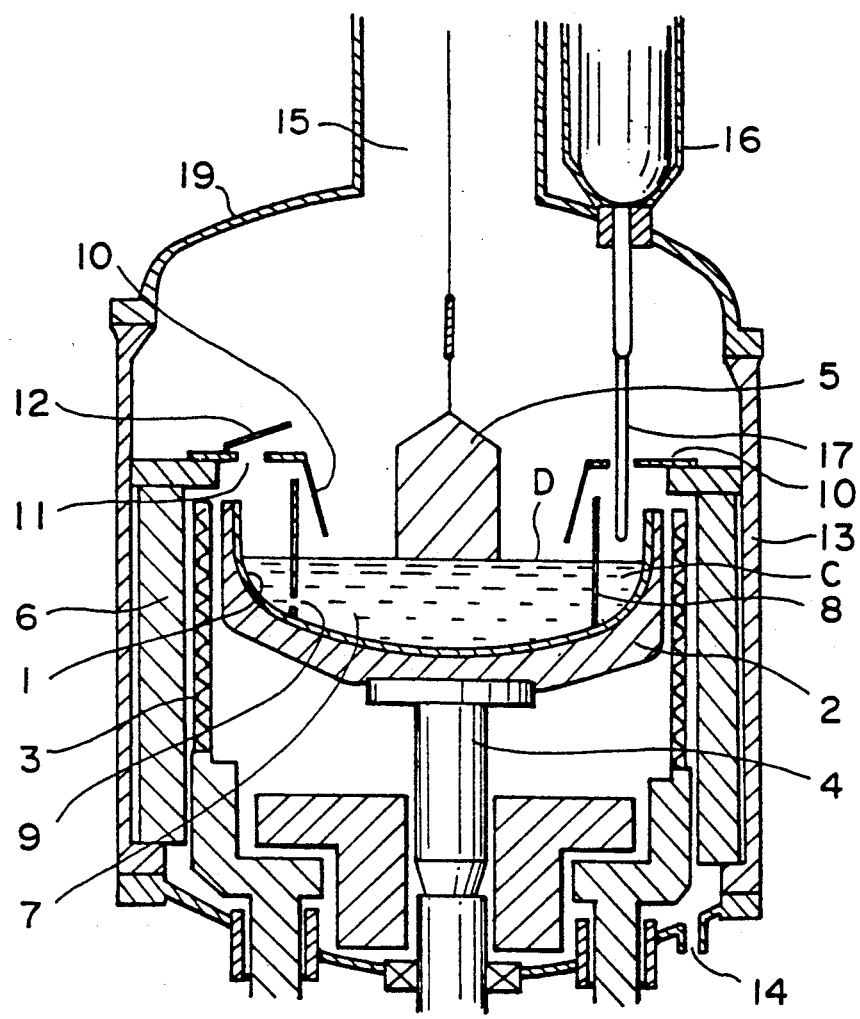
FIG. 9 is a longitudinal sectional view showing another embodiment of the silicon single crystal manufacturing apparatus according to the present invention.

The description of FIG. 10 is the same as the above-described FIG. 9. In the case of this embodiment, however, as shown in FIG. 12, the heat shielding member 12 is arranged to be dependently supported from each opening 11 of the heat keeping cover 10 below thereof except the inlet position of the material feed pipe 17. Similarly, the material for the heat shielding members 12 is tantalum. The space between the heat keeping cover 10 and each heat shielding member 12 is open with a width of 5 cm in the height direction on the outer peripheral side. In this case, the atmosphere gas flows as shown in FIG. 14 and practically all the atmosphere gas flows as shown by the flow passage A in the Figure. By virtue of this fact, the occurrence of fine SiO particles and their falling on the molten silicon surface in the single crystal growing section are pevented and there is no danger of the granular silicon being left unmelted and solidified in the material melting section.

Figure 15:
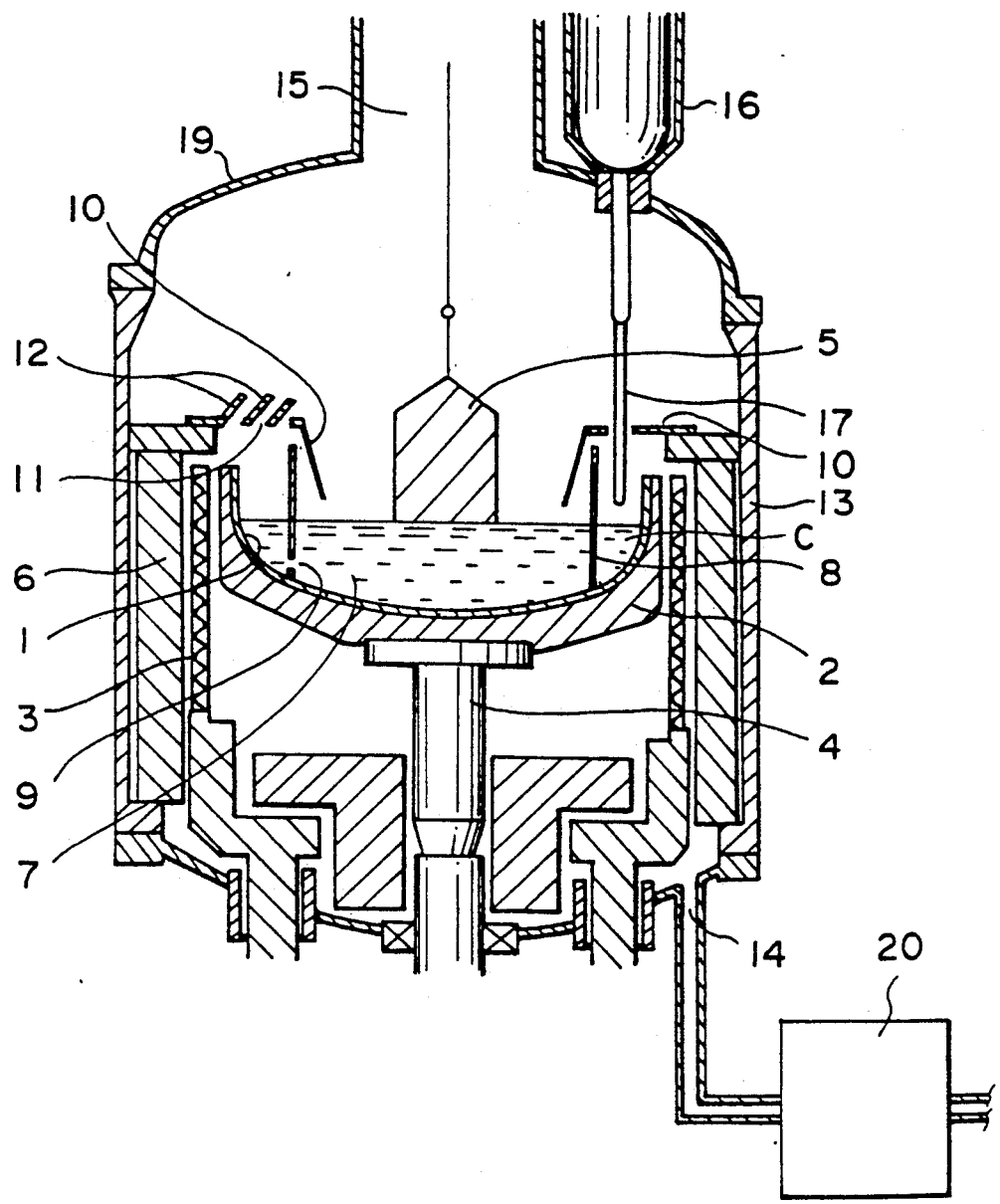
FIG. 15 is a longitudinal sectional view showing still another embodiment of the silicon single crystal manufacturing apparatus according to the present invention.
Figure 16:
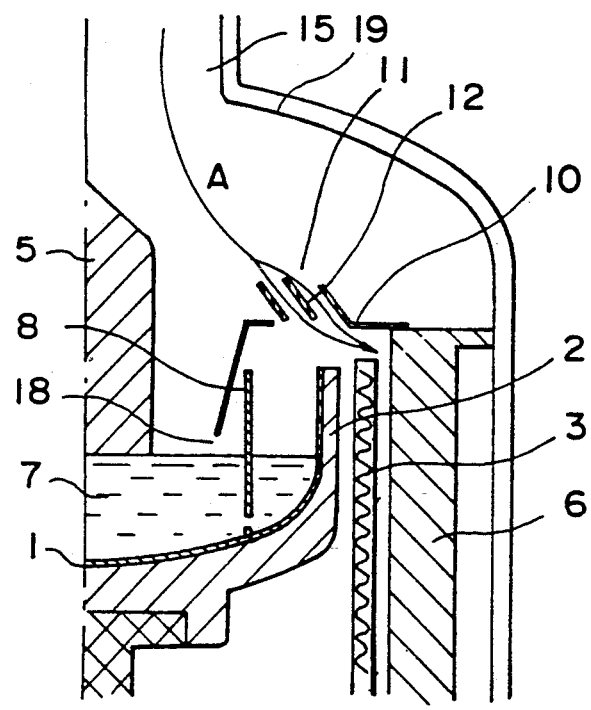
FIG. 16 is a schematic diagram of the gas flow in FIG. 15.

FIG. 15 shows a case in which the heat shielding member is formed by two or more slanted laminar members. In this case, the individual laminar members are arranged in such a manner that there is no gap which provides direct-communication in the vertical direction. FIG. 16 is a diagram showing the gas streams A in the case of FIG. 15.

It is to be noted that the description of the details of FIG. 15 is the same as in the case of FIG. 9.

INDUSTRIAL APPLICABILITY

In accordance with the present invention constructed as described above, there is practically no flow of a low temperature gas just above the molten silicon surface and the production of fine SiO particles and the falling of the fine SiO particles onto the molten silicon surface in the single crystal growing section is prevented, thereby greatly reducing the disintegration of silicon single crystals. In addition, due to the improved heat shielding effect, there is no occurrence of solidification at the partition member exposed on the molten silicon surface and also the starting material silicon supplied can be melted stably. As a result, while feeding the starting material silicon in an amount corresponding to the silicon single crystal pull rate, it is possible to stably manufature a large-diameter silicon single crystal of 5 inches or more in diameter with a pull rate of as high as about 1.6 mm per minute.

We claim:

1. An apparatus for manufacturing large-diameter silicon crystal of greater than 12 cm in diameter comprising:
   a rotary quartz glass crucible containing molten silicon;
   an electric resistance heater for heating said quartz glass crucible from the side thereof;
   a quartz glass partition for dividing said crucible into a single crystal growing section and a material melting section within said quartz glass crucible, said partition member having at least one small hold for permitting unidirectional flow of said molten silicon therethrough;
   a heat keeping cover for covering said partition and said material melting section with said heat keeping cover having one or more openings for establishing a flow direction for atmospheric gas away from said molten silicon with said openings located between said partition member and said electric resistant heater and arranged on an upper flat plate portion and/or an upper side conical portion of said heat keeping cover in such a manner that the total area of said openings is greater than the area formed between the lower end of said heat keeping cover and the surface of said molten silicon;

a feeder for continuously feeding starting material silicon to said material melting section and a means for reducing pressure within the heating chamber to 0.1 atmosphere or less.

2. A silicon single crystal manufacturing apparatus as set forth in claim 1, characterized in that said opening means comprises a plurality of separate openings.

3. A silicon single crystal manufacturing apparatus as set forth in claim 1, characterized in that heat shielding means made from a metal sheet is arranged above or below said opening means.

4. A silicon single crystal manufacturing apparatus as set forth in claim 3, characterized in that said heat shielding means is mounted on said heat keeping cover so as to be arranged above said opening means of said heat keeping cover, and that said heat keeping cover and that said heat shielding means are apart form each other by not less than 2 cm and not greater than 8 cm on a furnace inner peripheral side of said heat keeping cover.

5. A silicon single crystal manufacturing apparatus as set forth in claim 3, characterized in that said heat shielding means is dependently supported from said opening means of said heat keeping cover so as to be arranged below said opening means and that said heat keeping cover and said heat shielding means are apart from each other by not less than 2 cm and not greater than 8 cm on a furnace outer peripheral side of said heat keeping cover.

6. A silicon single crystal manufacturing apparatus as set forth in claim 1, characterized in that a total area of the areas of said opening means is in the range from 50 $cm^2$ to 1000 $cm^2$.

7. A silicon single crystal manufacturing apparatus as set forth in claim 3, characterized in that said heat shielding means is mounted on said heat keeping cover so as to be arranged above said opening means of said heat keeping cover, and that said heat shielding means comprises at least two laminar members arranged in such a manner that no vertically directly communicating gap is formed.

* * * * *